United States Patent [19]
Metz

[11] Patent Number: 5,201,415
[45] Date of Patent: Apr. 13, 1993

[54] TRANSPORT AND STORAGE SYSTEM FOR ELECTROSTATIC DISCHARGE SENSITIVE ELECTRONIC DEVICES

[76] Inventor: Carl W. Metz, 803 S. 4th St., St. Charles, Ill. 60174

[21] Appl. No.: 830,765

[22] Filed: Feb. 4, 1992

Related U.S. Application Data

[63] Continuation-in-part of Ser. No. 390,119, Aug. 7, 1989, abandoned.

[51] Int. Cl.$^5$ .................................................. B65D 85/42
[52] U.S. Cl. ........................................ 206/332; 312/223.1
[58] Field of Search .............. 206/334, 332, 328, 806; 312/322, 223.1

[56] References Cited

U.S. PATENT DOCUMENTS

| | | | |
|---|---|---|---|
| 2,669,499 | 2/1954 | Vanderplank | 312/322 |
| 3,552,595 | 1/1971 | Gerner | 206/332 |
| 4,308,953 | 1/1982 | Cohen | 206/334 |
| 4,427,114 | 1/1984 | Howell | 206/334 |
| 4,767,002 | 8/1988 | Malcolm | 206/334 |

FOREIGN PATENT DOCUMENTS 0281967 11/1988 Japan .................................. 206/328

OTHER PUBLICATIONS

EIA Standards Proposal No. 2033, *Packaging Material Standards for ESD Sensitive Items,* pp. 1-6 and 13-20.

*Primary Examiner*—Kenneth J. Dorner
*Assistant Examiner*—Gerald A. Anderson
*Attorney, Agent, or Firm*—Hill, Steadman & Simpson

[57] ABSTRACT

A system for handling, transporting and storing electronic circuit boards which are sensitive to electrostatic discharges includes an enclosed hollow tray into which the circuit board is placed, the tray being of an electrostatic dissipative material, a portable storage box having a conductive outer surface and an interior into which the tray is snugly received, and a fixed storage cabinet likewise having a hollow interior into which the tray is snugly received. Each of the storage box and storage cabinet have opposed interior surfaces formed with spaced grooved sheets into which the edges of the tray are positioned. These opposed surfaces are of an electrostatic dissipative material as well.

6 Claims, 1 Drawing Sheet

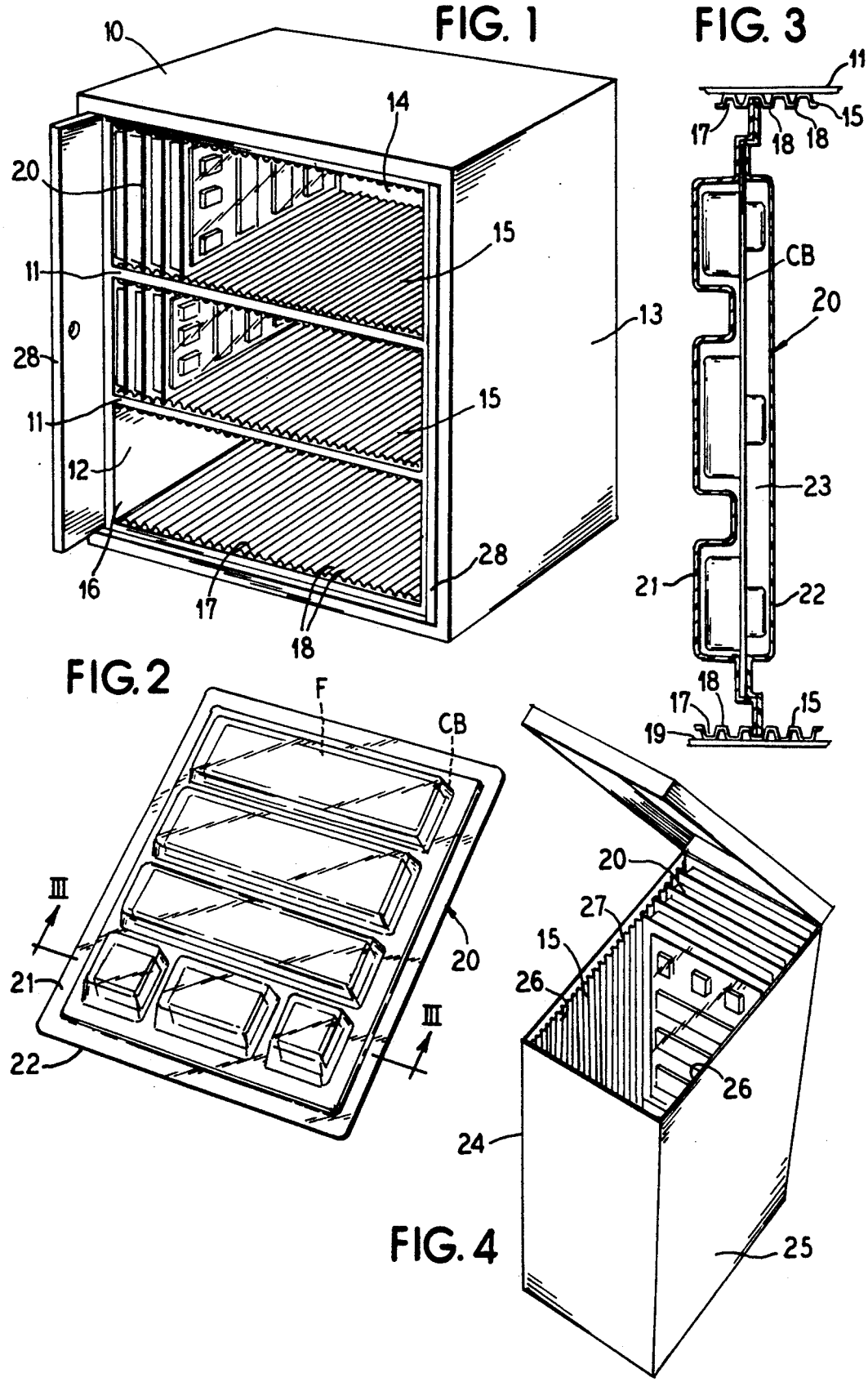

TRANSPORT AND STORAGE SYSTEM FOR ELECTROSTATIC DISCHARGE SENSITIVE ELECTRONIC DEVICES

This is a continuation-in-part of application Ser. No. 390,119, filed Aug. 7, 1989, now abandoned.

FIELD OF THE INVENTION

The present invention relates to a system for handling and storing electronics circuit boards, or other sensitive electronic devices, in a manner preventing the application of static electricity charges to the circuit board, or the substantially instantaneous discharge of a static electricity charge from the circuit board, or other sensitive electronic devices.

DESCRIPTION OF THE RELATED ART

In modern times, electronic circuit board, such as those used in the telecommunications and related electronic industries have become extremely expensive devices. Typically, such circuit boards now contain electronic components valued at many thousands of dollars. These boards, and devices like them, are extremely sensitive to transient static charges, such as those which may occasionally jump from a person's hand to the board, or from some container in which the board is stored. Similarly, such circuit boards can also be destroyed by an extremely rapid discharge of an electrical charge built up on the board during its storage or transportation. It has long been recognized, accordingly, that it is necessary to protect such circuit boards against uncontrolled static charges, either in a charge buildup or discharge situation.

Prior techniques for solving the static electricity control situation have provided shelf units in which the circuit boards are to be stored. An example is disclosed, for example, in U.S. Pat. No. 4,563,722, which provides for the mounting of circuit boards directly in the shelves of a grounded metal cabinet, the plurality of shelves being conductively secured to the cabinet. The shelves are constructed of a plastic manufactured by ACO, INC., of Oklahoma City, Okla., having a sheet resistance in the range of $10^{10}$ to $10^{13}$ ohms per square. The electrostatic discharge susceptible devices, such as circuit boards, are directly mounted on the shelves. Charged devices on the circuit boards are safely discharged while in the shelf unit and, it has been found that the circuit boards have been safely stored while the boards reside in such a cabinet, the boards being safe from static charges applied to the cabinet. However, the circuit boards are only protected while in the shelf and while untouched. The circuit boards remain unprotected during handling and transport. Charges applied directly to the circuit board by a careless employee could still damage the circuit board if the employee touches the circuit board without first grounding himself to the grounded cabinet by way of a guard, or the like, which has been conventionally provided in some known devices.

Similarly, in the prior art, portable boxes for the transportation of printed circuit boards have been provided. An example is the box disclosed in U.S. Pat. No. 4,427,114, in which a support liner of "anti-static" material having an electrical surface resistance in the range of $10^9$ to $10^{14}$ ohms per square is contained within an outer container of a material having a conductive or dissipative characteristic. Thus, transporting an electrostatic susceptible printed circuit board or the like protects the circuit board against an instantaneous grounding but, again, does not insulate the board from a careless contact between a human user who may approach the board and directly contact it without first grounding himself.

SUMMARY OF THE INVENTION

In accordance with the principles of the present invention, an anti-static, charge-dissipative fixed storage shelving container, or cabinet, has contained therein an anti-static, charge-dissipative circuit board container tray, and the circuit board container tray is transportable to or from the fixed cabinet in a portable Faraday package, or portable storage box, similarly having anti-static, charge-dissipative shelving matching the shelving of the first described container or storage cabinet. Together, the fixed storage cabinet, the circuit board tray and the portable container comprise a system for the storage and transportation of sensitive electrical devices according to the present invention without risk of damage from transient electrical charges. The circuit board container tray has a circuit board or other sensitive electronic devices inserted into it at the site of manufacture, repair, or re-manufacture of the circuit board under controlled environmental conditions and by a skilled workman who has full recognition of the extreme value of the circuit board and, thus, takes the necessary precautions.

In accordance with the system of the present invention, a circuit board is protected against static charges being applied suddenly to the board and against any preexisting charges that may be held by the circuit board being discharged suddenly from the board at any time during its travels from manufacture in a carefully controlled environment to its ultimate use in an electronic apparatus. Similarly, the user of the circuit board at the site of the electronic equipment employing the circuit board generally has a complete recognition of the value of the board, even when the board is in a failed condition and, by using the present system, may return the board in a protected manner to the original manufacturer for repair or servicing. Accordingly, through the utilization of the system of the present invention a circuit board or similar highly sensitive electronic component is protected throughout its useful life from inadvertent static charge or discharge that occasionally occurs, usually through carelessness or through handling by persons not fully cognizant of the value of the circuit boards, and accordingly, the critical need for their special care.

The circuit board container trays of the present invention provide a fully enclosed carrier for the circuit boards in which they remain from the time they are manufactured, or repaired, until they are installed for use, so that any but intentional manual manipulation of the circuit board is prevented. In accordance with a preferred embodiment of the present invention, the container tray is transparent to visible light, or other rays, such as infrared rays, that are readable by monitoring equipment. As a result, the contents of the tray may be determined without opening the tray, and inventory of the contents of a storage cabinet containing the trays may readily be accomplished without removing the printed circuit boards from their respective containers or otherwise exposing the circuit boards to risk of damage. Likewise, the container tray or unit may be placed in an inventory-controlled position in the cabinet for a visual inspection rather than by way of removal of the circuit board from the container unit or removal of the tray from the cabinet.

The material of which the container tray is formed is a charge dissipative material defined as having a resistivity that permits static electrical charges to gradually dissipate or bleed off so slowly that no damage is done to the enclosed electrical component from sudden changes in the charge level. Dissipative materials are generally accepted to be those having a surface resistivity in the range of greater than $10^5$ to less than $10^{12}$ ohms per square. In addition, the material is preferably an anti-static material which does not acquire an appreciable triboelectric static charge when rubbed against itself or any dissimilar surface or object. The circuit board is mounted in the tray in such a way that a space or air gap is present between the component leads on the circuit board and the interior of the tray. The resultant air gap coupled with the dissipative character of exterior surface of the tray provides a shielding effect.

The fixed storage cabinet and the portable box also included portions formed of a dissipative material, that is preferably also an anti-static material. The dissipative, anti-static material is positioned to contact the container tray mounted in the fixed cabinet or the portable box in such a way that static charge held by the circuit board are gradually dissipated and that static charges from outside are not applied abruptly to the circuit board.

BRIEF DESCRIPTION OF THE DRAWINGS

FIG. 1 is an isometric view of a storage cabinet constructed in accordance with the principle of the present invention.

FIG. 2 is an isometric illustration of a printed circuit board container tray unit.

FIG. 3 is a cross-sectional view taken along the line 111—111 of FIG. 2 illustrating the relationship of the printed circuit board to its container unit, and FIG. 4 is an illustration of a transportable field case with a circuit board container unit positioned therein prior to transportation thereof in the field.

DETAILED DESCRIPTION OF THE PREFERRED EMBODIMENT

As may be seen from a consideration of the drawings, an embodiment of a fixed storage cabinet is illustrated in FIG. 1. There, the cabinet 10 is provided with rigid, preferably steel, shelves 11, which are grounded to the sides 12 and 13 or the back 14 of the cabinet 10 in any conventional manner. For example, the shelves 11 may be provided with an electrical conductor screwed to the back border side of the shelf 11. The shelves 11 define interior spaced 16 within the cabinet 10. Each of the shelves 11 as well as the lower inside surface of the cabinet 10 is provided with a plastic cover sheet or liner sheet 15 on the top surface thereof. Additionally, the shelves 11 that are above the openings 16 in the cabinet 10 are provided with the plastic sheet liner material 15 on the underside surface thereof, as well. The liner sheets 15 are preferably of vacuum-formed plastic provided with parallel grooves 17 adapted to snugly and resiliently contact the edges of a circuit board-containing tray 20 slid into the spaces 16 defined by the shelves 11. The grooves 17 are separated by ridges 18 formed in the liner sheets 15, and the tray edges are between the adjacent raised ridges 18 in the sheets 15. In actual practice, it has been found that the ridges 18 may be effectively provided on ¼" centers, with a gap therebetween of approximately 1/16" forming the grooves 17, and with each ridge 18 extending about 3/32" vertically above the surface of the base film.

The vacuum-formed film is, for example, a PETG vacuum-formable plastic sheet of 0.015" to 0.020" thickness which is shaped with the desired grooves and ridges by vacuum forming and which may be secured to the shelf 11 by double-sided, pressure-sensitive tape 19 (as shown in FIG. 3). The sheet 15 may preferably be treated by an electron beam process marketed under the Trademark "STATICURE", (trademark of ITW), and which may be obtained commercially from ITW and/or Mustang Enterprises, Inc., 1917 South Street, Geneva, Ill. 60134. The electrical properties of this material, tested pursuant to ASTM-D-257, are within the dissipative range of greater than $10^5$ and less than $10^{12}$ ohms per square. In particular, the raw sheet material has a surface resistivity of approximately $10^8$ ohms per square before being vacuum formed, and has a slightly higher surface resistivity of between approximately $10^9$ and $10^{11}$ ohms per square after being formed into the shelf liners and trays. Other anti-static materials having a surface resistivity in the accepted dissipative range of greater than $10^5$ and less than $10^{12}$ ohms per square may be used, but it is preferred that in the selection of a material a resistivity on the same order is employed for both sides of the sheet 15, and that it have permanence under ordinary handling conditions.

In accordance with the preferred embodiment of the invention, the circuit board is not directly mounted in the grooves 17 of the liner sheets 15. Instead, it is preferred that the individual printed circuit board be placed in dedicated tray units 20 in which the circuit boards are transported, stored, inventoried, and dispensed. For this purpose, a tray 20, shown in FIG. 2, is preferably formed of two sheets 21 and 22 which, when combined, form a cavity 23 accommodating an individual circuit board and holding it firmly in position. A universal tray 20 may be provided in which a layer of bubbles made from the same material as the tray or the like is provided on both sides of the circuit board to prevent its motion within the tray 20. The preferred embodiment provides a tray 20 designed to accommodate the specific dimensions of an individual circuit board, and, in view of the tremendous cost of circuit boards typically involved, the cost of a special tray 20 made to its dimensions is minimal.

The tray 20 is transported from the manufacturing site to the fixed storage cabinet 10, and thence to the site of the electronic equipment, by way of a surface conductive box 24, such as for example, a Faraday box having a conductive outer surface 25. The transportable box is provided with a pair of opposed lining sheets 26 substantially identical to the lining sheets 15 in the fixed container 10, and attached to the conductive walls 25 of the box 24 by double-sided tape 27, or the like, as described above.

By virtue of the system arrangement above described, manual handling of the individual trays 20 will not cause a rapid charge or discharge of static electricity to or from the circuit board since the circuit boards are not removed from the trays. Further, the electrical discharge rate allowed by the anti-static, dissipative material prevents sudden dissipation of an electric charge which might otherwise injure an unprotected circuit board. This dissipative material satisfactorily controls the discharge of any electrical charge either to or from the tray 20, or to or from the printed circuit board within the tray 20 so that anti-static protection is provided throughout the preservice life of the individual circuit board which has been introduced into the protective system of the present invention.

I have found that the specific construction of all of the components of the system with anti-static material having a specified resistivity in the range of greater than $10^5$ to less than $10^{12}$ ohms per square, and preferably in the range of $10^7$ to $10^{11}$, provides a particularly effective rate of dissipation to ground, wherever the tray 20 is located and whatever its environment. A lower resistivity permits a possible substantially instantaneous charge buildup and discharge through the material holding the tray, while the utilization of essentially insulating material merely positions the circuit board for a violent discharge when it is handled without the utmost precaution. Accordingly, I have found that via use of the system of the present invention, substantial cost savings have been effected, and reliability of the printed circuit board when it reaches its destination is substantially increased.

In the embodiment illustrated, the fixed cabinet 10 has recessed doors 28 which pull forwardly and pivot to close in front of the cabinet 10. These permit the cabinet 10 to be closed to prevent inadvertent handling of the stored trays 20 and/or locked for security purposes. No grounding bar is shown across the opening, but it may be employed, particularly where circuit boards, alone, are to be stored.

The present system occupies relatively little space, requires relatively little time to use, and is inexpensive compared to the far higher costs of the circuit boards which it protects. The reduced loss and damage to sensitive electronic components enables the present system to pay for itself in little time. Most importantly, the present system is human engineered, i.e., easy to use even for the unskilled worker. As long as the circuit boards remain in their enclosed trays, they are protected. It is, therefore, contemplated to mark each tray with a sign or label reading, for example, "Do not remove contents from tray."

Although other modifications and changes may be suggested by those skilled in the art, it is the intention of the inventor to embody within the patent warranted hereon all changes and modifications as reasonably and properly come within the scope of his contribution to the art.

I claim as my invention

1. A manufacturing-to-use transport and storage system for electrostatic-discharge-sensitive electronic devices, the system including in combination:
    transport devices and portable storage devices and fixed storage devices for co-operable use with one another, each of said transport devices comprising a semi-rigid tray of anti-static and dissipative material having an internal cavity snugly receiving and supporting at least one of said electronic devices in a fully enclosed condition protected from static accumulation or discharge relative to an environment outside said tray, said anti-static and dissipative material having a surface resistivity in a range of approximately $10^5$ to $10^{12}$ ohms per square;
    said portable and fixed storage devices each including a plurality of rigid shelf means disposed in parallel relation for defining an opening between adjacent shelf means, each of said shelf means comprising an anti-static and dissipative material having a surface resistivity in a range of $10^5$ to $10^{12}$ ohms per square and having spaced grooves extending transversely of said shelf means wherever a respective shelf means faces another of said shelf means across an opening and each of said grooves having resilience in a direction perpendicular to its respective shelf means;
    said trays being at least partially transparent to sensible radiation permitting sensing of any contents of said trays by an external sensing mechanism and having electronic device-contacting raised areas for dissipatively supporting the electronic device within said internal cavity and having external edges extending into said grooves, with an edge-to-edge width of said tray providing a resilient contact fit in opposing ones of said grooves of said opening; and
    said portable storage device comprising a manually transportable box containing a pair of said shelf means mounted in opposed relation and conductively connected to a conductive outer housing of said transportable box.

2. The system set forth in claim 1 wherein said fixed storage device and its respective shelf means are grounded.

3. The system set forth in claim 1 wherein said fixed storage device comprises a cabinet in which is horizontally mounted a plurality of said shelf means defining a plurality of said openings for insertion and storage of a plurality of said trays separate and spaced from one another, each of said shelf means having ends at side walls of said cabinet, and further comprising closure doors mounted on said cabinet so as to be movable from a closed position across said openings to an open position at least substantially flush with said ends of said shelf means thereby providing unblocked access to said openings.

4. A system for handling, transporting and storing electrostatic discharge sensitive electronic devices, comprising:
    an openable enclosed tray defining a hollow interior within which are placable the electrostatic discharge sensitive electronic device, said tray being of an electrostatic dissipative material having a resistivity in a range of greater than $10^5$ to less than $10^{12}$ ohms per square, said tray being in contact with the electronic device when the device is mounted therein, said tray having a pair of opposed edges;
    a portable storage box having an electrically conductive outer surface and defining an interior opening for receiving said tray, a pair of opposed interior surfaces which define said interior opening being of electrostatic dissipative material having a resistivity in a range of greater than $10^5$ to less than $10^{12}$ ohms per square and including spaced grooves for receiving said opposed edges of said tray at said opposed interior surfaces; and
    a relatively fixed storage cabinet of an electrically conductive material and defining at least one interior opening for receiving said tray, a pair of opposed interior surfaces which define said at least one interior opening being of electrostatic dissipative material having a resistivity in a range of greater than $10^5$ to less than $10^{12}$ ohms per square and including spaced grooves for receiving said opposed edges of said tray at said opposed interior surfaces.

5. A system as claimed in 4, further comprising at least one shelf mounted in said fixed storage cabinet to separate said at least one interior opening into a plurality of interior openings.

6. A system as claimed in claim 5, further comprising means for grounding said fixed storage cabinet.

* * * * *